United States Patent [19]  [11] 4,076,574
Pastor et al. [45] Feb. 28, 1978

[54] REACTIVE ATMOSPHERE CRYSTAL GROWTH METHOD

[75] Inventors: Ricardo C. Pastor, Manhattan Beach; Antonio C. Pastor, Santa Monica, both of Calif.

[73] Assignee: Hughes Aircraft Company, Culver City, Calif.

[21] Appl. No.: 645,866

[22] Filed: Dec. 29, 1975

[51] Int. Cl.² .................. B01J 17/08; C01D 3/20
[52] U.S. Cl. .................. 156/616 R; 156/617 R; 156/DIG. 71; 156/DIG. 80; 156/DIG. 83; 156/DIG. 89; 423/490; 423/499
[58] Field of Search .............. 156/DIG. 71, DIG. 80, 156/DIG. 83, 617 SP, 619, DIG. 89, 616 R, 617 R, 617 H, 617 M; 423/490, 499

[56] References Cited

U.S. PATENT DOCUMENTS

| 792,632 | 6/1905 | Tee | 423/490 |
|---|---|---|---|
| 2,550,173 | 4/1951 | Swinehart | 156/DIG. 71 |
| 2,770,526 | 11/1956 | Lander | 423/490 |
| 3,565,700 | 2/1971 | Root | 423/490 |
| 3,796,552 | 3/1974 | Robinson | 156/616 |
| 3,826,817 | 7/1974 | Pastor | 156/DIG. 80 |
| 3,935,302 | 1/1976 | Pastor et al. | 423/490 |
| 3,969,491 | 7/1976 | Pastor et al. | 423/499 |

FOREIGN PATENT DOCUMENTS

| 1,326,657 | 5/1962 | France | 423/490 |
|---|---|---|---|
| 1,137,582 | 12/1968 | United Kingdom | 156/620 |
| 1,123,991 | 8/1968 | United Kingdom | 423/490 |
| 223,761 | 7/1968 | U.S.S.R. | 156/617 SP |

OTHER PUBLICATIONS

Kiyama, Chemical Abstracts, 1952, Col. 4406-g-h, 1 page.
Schmidt, Nat. Res Bul., vol.6, #8, pp. 771-774, (1971).
Lawson et al., Prep. of Single Crystals, London, Butterworths Sci. Pub., 1958, pp. 14 to 18.

Primary Examiner—Stephen J. Emery
Attorney, Agent, or Firm—B. T. Hogan, Jr.; W. H. MacAllister

[57] ABSTRACT

Alkali metal halide crystals exhibiting substantially improved physical and optical transmission characteristics are grown from starting powders by a one step Reactive Atmospheric Processing (RAP) method.

18 Claims, No Drawings

REACTIVE ATMOSPHERE CRYSTAL GROWTH METHOD

The invention herein described was made in the course of or under a contract or subcontract thereunder with the United States Air Force.

RELATED APPLICATIONS

In U.S. application Ser. No. 349,516, filed Apr. 9, 1973, by R. C. Pastor, the treatment of metal halide laser window surfaces by exposure to gaseous nascent halogens for the purpose of improving structural properties and optical transmission is disclosed.

In U.S. application Ser. No. 351,214, filed Apr. 16, 1973, by R. C. Pastor and A. Timper, we disclosed that alkali metal halides may be purified, prior to their use as starting materials for the growth of alkali metal halide crystals, by scrubbing the material in its molten form with gaseous nascent halogens which correspond to the halide anion. This application was abandoned in favor of continuation in part application Ser. No. 605,697 which issued as U.S. Pat. No. 3,969,491 on July 13, 1976.

In U.S. application Ser. No. 587,746 (a Continuation-in-Part Application of Ser. No. 416,899), filed June 17, 1975, by R. C. Pastor (now issued as U.S. Pat. No. 3,932,597 dated Jan. 13, 1976), an improved alkali metal halide purification method is disclosed whereby the crystal growth starting materials are purified by scrubbing with halide-source species in their vapor phase and cast in the form of an ingot to be used directly in subsequent halide crystal growth processes.

In U.S. application Ser. No. 446,581, filed Feb. 27, 1974, by R. C. Pastor, Kaneto Arita, and Morton Robinson (now issued as U.S. Pat. No. 3,935,302 dated Jan. 27, 1976), an invention directed to the preparation of laser windows from single metallic component halide crystals purified by regrowth from the congruent melt is disclosed.

In U.S. application Ser. No. 449,148, filed Mar. 7, 1974, by R. C. Pastor and Morton Robinson (now issued as U.S. Pat. No. 3,959,442 dated May 26, 1976), an invention directed to the preparation of single crystal laser emission compounds, of the formula $ARF_4$, by a direct congruent melt crystal growth process is disclosed.

Each of the above applications has been assigned to a common assignee and are the results of an Air Force sponsored research effort by Hughes Aircraft Company in this area.

BACKGROUND OF THE INVENTION

1. Field of the Invention

This invention is concerned with the preparation of high purity alkali metal halide single crystals.

2. Description of the Prior Art

Metal halide crystals are being used extensively as windows for high power lasers and other optical applications. Their use in laser applications is limited by rigid constraints on anion purity. The vibrational modes of anions are infrared active and often involve high absorption cross sections so that much less than 1 ppm is needed to achieve absorption coefficients below 0.001 $cm^{-1}$ in the crystal (C. J. Duthler, J. Appl. Phys. 45 2668, 1974).

Among other anions found in alkali metal halides are $OH^-$ ions. These anions pose special problems because $H_2O$, their source, is ubiquitous. The oxygen-hydrogen vibration is active at 2 to 4 $\mu m$ and the oxygen-cation vibration is active at 9 to 10 $\mu m$. The substitutional $OH^-$ dipole couples with the dipole consisting of a bivalent metal ion impurity and a metal ion vacancy ("Influence of $OH^-$ Ions on Infrared Absorption and Ionic Conductivity in Lithium Fluoride Crystals," by T. G. Stoebe, J. Phys. Chem. Solids 28, 1375, 1967).

Conventional prior art crystal growth processes have not been effective in reducing the level of $OH^-$ concentrations in the finished crystals.

The effect of $OH^-$ ions on the absorption characteristics of alkali metal halide single crystals has been long recognized and considerable resources have been devoted to solving this problem. The results of one study having as its objective the elimination of $OH^-$ ions from alkali metal halides to be used as starting materials in subsequent single crystal growth processes are reported in British Pat. No. 1,137,582, issued to Miroslav Lehl in December of 1968. According to the U.S. Pat. No. 1,137,582 disclosure, anions of a starting alkali metal compound other than halide is replaced by a halogen. Gaseous halides of carbon or sulfur, or a thionyl or carbonyl gaseous halide in an inert gas mixture are fed into a melt of the starting material at a temperature not to exceed 1250° for a period ranging from 5 to 10 minutes. The gaseous mixture is removed, the ampoule containing the purified halide is sealed and then allowed to cool down. While the process is alleged to yield alkali metal halides which show no measurable infrared or ultraviolet absorption, it does not teach how to ultimately produce a single crystal halide which exhibits physical and optical characteristics suitable for laser applications in the 2–6 $\mu m$ and 10.6 $\mu m$ regions where $OH^-$ ion concentrations below a mole fraction of $10^{-6}$ are required.

The U.S. Pat. No. 1,137,582 process as it relates to repurification is defective in producing ultra-pure starting material to be used ultimately for crystal growth in that it contains steps which by their very nature tend to rehydrolyze the purified materials. Specifically, $H_2O$ is released from the walls of the ampoule during the ampoule sealing step when there is no halogen purge present to getter the moisture. Alkali halides purified by this method are believed to contain slightly less than a mole fraction of $10^{-5}$ $OH^-$, an amount greater by a factor of 10 than that required of the finished alkali metal halide crystal used in laser applications.

A similar material purification process is also disclosed in British Pat. No. 1,123,991, published Aug. 14, 1968. The U.S. Pat. No. 1,123,991 disclosure teaches a method of preparing alkali metal halides from alkali sulfates, sulfides, nitrides, hydrides, and carbonates by halogenating said compounds mixed with either powdered sulfur or carbon and heated beyond their melting points. In each of the examples disclosed, gaseous chlorine or bromine was fed into the melt of starting materials to achieve an anion exchange reaction. The resulting product contained unreacted traces of carbon or sulfur on the surface at the end of the process. This material preparation process is not nearly as effective as the purification process disclosed by Applicant in U.S. application Ser. No. 587,746, nor does the disclosure contain teachings which can be used to avoid the recontamination of the purified materials which occurs during subsequent handling in preparation for use in conventional crystal growth processes.

The largest supplier of ultra pure alkali metal halide single crystals is Harshaw Chemical Company of Ohio.

Harshaw is believed to use a vacuum crystal growth process. A comparison of air-grown and vacuum-grown metal halide Harshaw crystals is discussed by L. S. Combes et al in "Mechanical and Thermal Properties of Certain Optical Crystalline Materials," *J. Opt. Soc.* 41 (No. 4), 215 (1951). An evaluation of Harshaw crystals is given by F. Horrigan, et al in "Windows for High Power Lasers," *Microwaves*, pp. 68–76 of Laser Technology Section (January 1969). Optical absorption at 10.6 μm is reported to be greater than .1%/cm with an ultimate strength of 640 psi for KCl crystals.

THE INVENTION
Summary

In view of the well established need for ultra pure alkali metal halide single crystals and the dearth of processes for preparing such crystals, it is an objective of this invention to provide a process whereby single crystals of alkali metal halides can be prepared which contain ultra low anion or cation contaminants. A second objective of this invention is to provide a single step crystal growth process which avoids the potential for rehydrolization of purified crystal growth starting materials occasioned by manual handling operations. A further objective of this invention is to provide a material purification and crystal growth process that is scalable whereby large single crystals of alkali metal halides can be prepared.

In meeting the above-stated objectives, a process whereby ultra pure large single crystals of alkali metal halides has been disclosed. This process begins with the placing of commercially available alkali metal halide powders in a crystal growth crucible for purification and subsequent conversion from a polycrystalline form into a large single crystal.

The crystal growth crucible and the starting powders are purified of all anion and cation impurities by a nascent halogen purge at elevated temperatures.

Following the purification interval, and without interruption of the purifying purge, crystal growth is initiated from a melt of the purified starting material. The crystal is grown and allowed to cool to ambient temperatures entirely in the presence of a dynamic nascent halogen purge.

After the the initiation of the process, there are no intermediate steps wherein the starting material may be exposed to sources of impurities. Alkali halide crystals prepared by this process exhibit substantially superior physical and optical absorption characteristics over that exhibited by single crystals prepared by prior art processes.

DETAILED DESCRIPTION OF THE INVENTION

In seeking to provide alkali halide crystals suitable for laser applications in the 2 to 6 μm and 10.6 μm wavelength range, researchers have noted the correlation between the purity of the crystals and their usefulness. Generally, the solution to the problem appeared to be in seeking to grow large single crystals from starting materials which are as pure as possible and to maintain that purity via vacuum or inert atmosphere processing techniques.

It has been discovered that ultra pure single crystals of alkali metal halides can be prepared by crystals grown in a reactive atmosphere. This discovery is an extension of the Reactive Atmosphere Processing (RAP) concept developed by the Applicants to purify alkali metal halides, disclosed in U.S. Pat. No. 3,932,597 by R. C. Pastor dated Jan. 13, 1976. However, the present invention is not constrained by the limitations associated with the production of an HX(g) in keeping the RAP index as low as possible. The significance of a low RAP index is disclosed in the following discussion.

The heterogeneous reaction (hydrolysis) in crystal growth is $$X^-(c) + HOH(g) \rightleftharpoons OH^-(c) + HX(g), \quad (1)$$

where $X^-$ represents a halide, (c) a condensed phase (crystal and/or melt), and (g) the gas phase. The relation of concentrations in (c) to the sources in (g) is, $$C = \frac{[OH^-(c)]}{[X^-(c)]} = K \frac{P(H_2O)}{P(HX)}, \quad (2)$$

where K, the equilibrium constant of Equation 12, is fixed in the crystal growth of a material at its melting point. To achieve a low C, the figure of merit of a RAP procedure is the reciprocal of the RAP-index, $P(H_2O)/P(HX)$.

According to Equation 2, congruent growth with (g) based on the provision of a vacuum or an inert gas is characterized by a poor RAP-index, i.e., a high value. The use of HX in (g) is an improvement but the RAP index is limited by $H_2O$ sources: dewpoint of the gas, moisture content of the charge and the outgas, corrosion action of HX on oxide surfaces, etc. Such procedures focus on the manipulation of (g). Other procedures focus only on (c), e.g., the scavenging of $O^{-2}$ in $CaF_2$ melt by $PbF_2$ (D. C. Stockbarger, J. Opt. Soc. Am. 39, 731, 1949).

$$PbF_2(c) + O^{-2}(c) \rightleftharpoons 2F^-(c) + PbO(c). \quad (3)$$

Excess $PbF_2$ and PbO distill off. Residual amounts of the scavenger throttle the growth rate. The effectiveness of scavenging is subject to the RAP-index because, $$2 OH^-(c) \rightleftharpoons O^{-2}(c) + H_2O(g). \quad (4)$$

If the RAP-index is high, it can be shown from Equations 1, 3, and 4 that the net effect is the hydrolysis of $PbF_2$ in the $CaF_2$ melt by $H_2O(g)$.

An effective RAP procedure provides both paths for scavenging $OH^-(c)$ and $H_2O(g)$ at rates faster than provided by the sources. Thus, Equation 1 is represented as the sum of two such reactions. For instance, the equivalent of RAP with $X_2(g)$, $COX_2(g)$, and $CX_4(g)$ is as follows:

(a) $X^-(c) + HX(g) + (\frac{1}{4})O_2 \rightleftharpoons OH^-(c) + X_2(g)$ (b) $X_2(g) + H_2O(g) \rightleftharpoons 2 HX(g) + (\frac{1}{2})O_2(g) \quad (5)$ (a) $X^-(c) + HX(g) + CO_2(g) \rightleftharpoons OH^-(c) + COX_2(g)$ (b) $COX_2(g) + H_2O(g) \rightleftharpoons 2 HX(g) + CO_2(g) \quad (6)$ (a) $X^-(c) + HX(g) + (\frac{1}{4})CO_2(g) \rightleftharpoons OH^-(c) + (\frac{1}{4})CX_4(g)$ (b) $(\frac{1}{4}) CX_4(g) + H_2O(g) \rightleftharpoons 2 HX(g) + (\frac{1}{4})CO_2(g). \quad (7)$ Note that the (b) of each reaction couple throttles the RAP-index since two moles of HX are formed at the expense of one mole of $H_2O$. RAP with $X_2$, Equation 5b, is most effective only for $X_2 = F_2$. With $X_2 = Cl_2$, RAP begins to be effective at $>700°$ C where chlorine becomes more oxidizing than oxygen. But with $X_2 = Br_2$, this cross-over is at a temperature much above the melting point of metal bromides, and in $X_2 = I_2$, the reaction is displaced even further to the left.

Table 1 is a comparison of the three RAP procedures for chlorides. The thermodynamic value of the RAP-index is calculated for the case where the source is at 0.1 atm and the initial value of $P(H_2O) = 10^{-4}$ atm (the equilibrium constants as a function of temperature were obtained from, "Thermodynamic Properties of 65 Elements — Their Oxides, Halides, Carbides, and Nitrides," by C. E. Wicks and F. E. Block, Bull. 605 of the Bureau of Mines, U.S. Government Printing Office, 1963). It is seen that $Cl_2$ is the poorest RAP agent of the three. In KCl growth (mp = 1049° K), the RAP index of $Cl_2$ is approximately the equivalent of HCl with a dewpoint ($-60°$ C) considerably above its boiling point ($-85°$ C).

The use of $CX_4$ is preferred over that of $COX_2$ because of toxicity and ease of handling. Now, $CX_4$ pyrolyzes to yield nascent X (A. H. Sehon and M. Szwarc, Proc. Roy. Soc. A209, 110, 1951), $$CX_4 \rightarrow CX_3 + X, \tag{8}$$

which presents the possibility of chain propagation, (a) $CX_3 + CX_4 \rightarrow C_2X_6 + X$ (b) $X + CX_4 \rightarrow X_2 + CX_3.$ \hfill (9)

Termination reactions yield more $C_2X_6$ and $X_2$, (a) $CX_3 + CX_3 \rightarrow C_2X_6$ (b) $X + X \rightarrow X_2.$ \hfill (10)

The advantage to having X is in the electrontransfer reaction, $$X + OH^- \rightarrow X^- + OH, \tag{11}$$

where the free energy change (unit: kcal/mole) for forward displacement, in the gas phase, is favorable for all X ("Bond Energies, Ionization Potentials and Electron Affinities," by V. I. Vedeneyev, L. V. Gurvich, V. N. Kondratyev, V. A. Medvedev and Ye. L. Frankevich, St. Martin's Press, 1966): X = F, $-42.7$; X = Cl, $-48.0$; X = Br, $-41.7$; and X = I, $-36.0$. The $OH^-(c)$ need not diffuse out to the (g)-(c) interface as a resonance transfer between $X^-(c)$ and X at the interface brings X(c) in the proximity of $OH^-(c)$.

The net reaction of the above pyrolysis is, $$CX_4 \rightarrow (\tfrac{1}{2})C_2X_6 + (\tfrac{1}{2})X_2. \tag{12}$$

Unfortunately, there is another competing path in pyrolysis, $$CX_4 \rightarrow C + 2 X_2. \tag{13}$$

From the preceding discussion, the latter path is undesired except for X = F, in which case the forward displacement is negligible even at 2000° K. Assigning $f$ to the probability of the path given by Equation 13 and $1 - f$ to Equation 12, $$CX_4 \rightarrow fC + (1-f)/2\; C_2X_6 + (3f+1)/2\; X_2. \tag{14}$$

The temperature range in which decomposition of $CX_4$ is high, and the value of $f$ low, is applicable to RAP crystal growth of the corresponding metal halide.

Given the above purification mechanism, the key to an effective purification process and subsequent growth of a single crystal is in the maintenance of a low value of $f$ during the pyrolysis of a halogen source compound.

Inasmuch as the pyrolysis of carbon tetrahalide, $CX_4$, in an inert gas (say, He) occurs with two competing reactions as shown in Equations 12-14, all $CX_4$ compounds are not effective RAP agents.

$CBr_4$ proved to be an inadequate RAP agent for the growth of KBr (mp = 730° C) because $f = 1$ at temperatures $\geq 700°$ C, while $CCl_4$ was applicable to the growth of KCl (mp = 776° C) because the $f = 0$ path was four times more probable than the $f = 1$ path from 700° to 900° C. A comparison between $CBr_4$ and $CCl_4$ as RAP agents is shown in Table 2. From the value of $f$, shown in Table 2, it is appreciated that RAP crystal growth with $CBr_4$ is applicable at working temperatures $<600°$ C. It is not applicable to KBr growth from the melt because at the melting point (730° C) pyrolysis is dominated by Equation 13. However, RAP crystal growth with $CCl_4$ is applicable up to 900° C and is, therefore, useful to the congruent growth of metal chlorides in general. At the melting point of KCl (776° C), the reaction path shown in Equation 12, i.e., involving the formation of X, is four times favored over that of Equation 13.

The case of $f = 0$ in Equation 14 may be rewritten to show explicitly the formation of nascent form of the halogen.

$$CX_4 \rightarrow CX_3 + kX \tag{15}$$

The decay constant, $k$, of Equation 15 is found to be represented by $$k = \nu\, exp(-D/RT), \tag{16}$$

where $\nu$ and D are the C-X bond frequency and dissociation energy respectively (A. H. Sehon and M. Szwarc, Proc. Roy. Soc. A209, 110, 1951). For crystal growth, the value of $k$ must be constrained to $0 < k < 1$ at the melting point of the metal halide in question. At $k = 0$, no nascent halogen is formed. But at $k \geq 1$, the gas entering the growth apparatus is readily pyrolyzed before reaching the melt and the nascent form is readily lost, $$X + X \rightarrow X_2. \tag{17}$$

It can be shown (see Table I) that the molecular halogen form, except in the case of $X_2 = F_2$, is an inadequate RAP agent for the growth of alkali metal halides.

The temperature dependence of $k$ which describes the formation of nascent halogen explains the inadequacy of $CBr_4$ as a source of Br. At the melting point of KBr, T = 1003° K; for $k < 1$ in Equation 16, it follows that C-Br must have $D > RT\ln\nu$ or $D > 61$ kcal since $\nu = 1.8 \times 10^{13}$/sec. This constraint also provides the basis for explaining the inadequacy of $CHBr_4$ to RAP growth of KBr. The values of D at the melting point of KBr from $CBr_4$ and $CHBr_3$ are 49 and 56 kcal respectively.

Consequently, other derivatives, $CY_nX_{4-n}$, where n = 1, 2, or 3, were considered. With Y being an atomic substituent more strongly covalently bonded than X (say, H or another halogen), the two parameters, Y and n, provide a graded increase in the dissociation energy of C-X. Thus, in the case of X = Br, the D values in kcal for C-Br are: $CBr_4$, 49; $CHBr_3$, 56; $CH_2Br_2$, 63; $CH_3Br$, 67; and $CF_3Br$, 65.

Utilizing the above information relative to the formation of nascent halogens, single crystals of alkali halides were grown in modified quartz crucibles per the Bridgman method. The carrier gas (He) flowed at $\sim 0.5$ $cm^3$/second. The melt was soaked for $\sim 100$ hours and crystal growth was carried out at a lowering rate of 1.5 to 3 mm/hour.

As expected, attempts to grow KBr in a quartz crucible by the vertical method failed with $CBr_4$ as the RAP source. The melt persisted in wetting the crucible, an indication of partial hydrolysis (this behavior provides a useful indicator to the reduction of $OH^-$ content in the melt). Consequently, although one succeeded in growing a single crystal ingot, the crystal and/or crucible cracked during cooldown.

The situation was different in the case of KCl and NaCl, grown by the vertical Bridgman method in quartz crucibles with $CCl_4$ as the RAP source. The single-crystal ingot slipped out easily and the crucibles were reusable over and over. This feature was reproduced in the growth of 3 to 10 cm diameter ingots.

A comparison of the steady state effluent, KCl RAP growth versus pyrolysis of $CCl_4$, was made. Growth at 800° C and $v$ = 0.5 $cm^3$/sec gave 15 millimoles $Cl_2$ per hour. Pyrolysis at 800° C and a flow, $v$, of 0.8 $cm^3$/sec gave 12 millimoles $Cl_2$ per hour.

Noteworthy changes have resulted in the performance parameters of these anion-ultrapure materials. In KCl, comparing the RAP crystal with earlier vintage materials (F. Horrigan, C. Klein, R. Rudko and D. Wilson, Microwaves, pp. 68–76, January 1969), the measured absorption in a 10.6 $\mu m$ $CO_2$ laser colonimeter yielded an absorption coefficient of 0.00013 $cm^{-1}$, which value is more than an order of magnitude lower. Also, with a 0.6 $\mu sec$ pulse, the $CO_2$ laser damage threshold of RAP KCl crystal is >7.8 × $10^9$ watts/$cm^2$, which is many orders of magnitude larger than the value reported earlier. The fracture strength, as measured by 4-point bending (Instron) exceeds 4000 psi, which value is about one order of magnitude larger.

While our initial studies showed that substantially improved KCl and NaCl single crystals were possible when an inert carrier gas was employed, the generation of C and $Cl_2$ led to various problems. The deposited C is possibly a contributing factor to significant deviations of the ingot from monocrystallinity and greatly reduces the utilizable fraction. The build up of $Cl_2$ provides the limiting factor to the lifetime of the growth apparatus.

With the object of overcoming these drawbacks, pyrolysis measurements of $CX_4$ in a reactive carrier gas were studied. The temperature of the $CX_4$ source was held at 24° C, and the carrier gas was flowed at $\sim 0.8$ $cm^3$/second which resulted in a residence time ($\tau$) in the pyrolysis chamber of $\sim 4$ minutes.

A comparison of the steady-state concentration of $X_2$ in the effluent in the pyrolysis of $CX_4$/He and $CX_4/CO_2$, at equal residence time, is given in Table 3 for $CBr_4$ and in Table 4 for $CCl_4$. A thick carbon deposit forms in the pyrolysis of $CBr_4$/He and $CBr_4/CO_2$. More efficient thermalization by $CO_2$ leads to a heavier carbon deposit upstream. However, as shown by Table 3, the carrier gas has no effect on the halogen concentration.

With $CCl_4$, Table 4 shows that at 500° C the rate of halogen formation is $\sim 200\%$ higher in $CO_2$. Because of the difference in molecular mass and heat capacity, $CO_2$ is the more efficient thermalizing agent. The difference in the rate between the carrier gases descreases with an increase in pyrolysis temperature; the crossover is at 700° C. From 700° to 800° C, the rate increases with He but decreases with $CO_2$. We attribute this feature to the reaction of $CO_2$ to the carbon deposit,

$$C + CO_2 \rightarrow 2 CO, \qquad (18)$$

and the resulting CO tying up free chlorine ("Mellor's Modern Inorganic Chemistry," edited by G. D. Parkes, p. 403, Longmans, 1967),

$$CO + Cl_2 \rightarrow COCl_2. \qquad (19)$$

For a 20-hour pyrolysis at 800° C, a light carbon deposit formed in $CCl_4$/He but none in $CCl_4/CO_2$. This feature was reproduced in crystal growth.

The pyrolysis behavior of $CHBr_3$/He was not too different from that of $CBr_4$/He. The onset of pyrolysis by way of the $f = 0$ branch occurred considerably below the melting point of KBr (730° C).

The results of the pyrolysis of $CH_2Br_2$, D = 63 kcal (V. I. Vedneyev, supra), in He, is given in Table 5. The fourth and fifth columns show that $Br_2$ and HBr form as low as 200° C. While $Br_2$ formation increases up to 500° C and drops with further increase in temperature, HBr formation increases monotonically with temperature. At 500° C, the HBr concentration is one order of magnitude larger than that of free $Br_2$, and at 900° C, the ratio is $\sim 10^3$. These results indicate that gas-phase formation of HBr at low temperatures from $CH_2Br_2$, unimolecularly or bimolecularly, occurs. The drop in concentration of free $Br_2$ at the higher temperature suggests a second mechanism for HBr formation, i.e., reaction of Br or $Br_2$ with $CH_2Br_2$. Although the C—H bond in $CH_2Br_2$ has D = 99 kcal (V. I. Vedneyev, supra), bond rupture requires an investment of only 11 kcal because D = 88 kcal for HBr (V. I. Vedneyev, supra). This is for the case of nascent bromine. For $Br_2$, the investment is 57 kcal, which value is still less than the C-Br value for $CH_2Br_2$ (D = 63 kcal).

From the preceding analysis, one would expect that only a small fraction of HBr results from the attack of Br on the $OH^-$ impurity in the RAP growth of KBr. Also, it would be futile to employ $CH_3Br$, D = 67 kcal (V. I. Vedeneyev, supra). Indeed, pyrolysis of $CH_3Br$/He from 400° to 1000° C yields no free halogen. The effluent HBr concentration showed the amount of $CH_3Br$ pyrolyzed: <0.1% at 400° C, 51±3% at 600° to 800° C and 60% at 1000° C. The increase in D in the presence of atomic substituents which are more strongly covalently bonded has instead led us to study $CF_3Br$, D = 65 kcal (V. I. Vedeneyev, supra).

The results of the pyrolysis of $CF_3Br$/He is given in Table 6. A 10 mole % mixture in He was obtained (Matheson Gas Products). Molecular weight determination showed the composition to be 11.4 ± 0.2 mole % (5-liter bulb, Regnault method). As in the case of $CH_2Br_2$/He, pyrolysis was carried out in a horizontal chamber to accommodate silica boats loaded with KBr powder. At a flow of 0.3 to 0.4 $cm^3$/sec, the furnace was held at 200° C for 15 hours to dry the KBr. Table 6 shows that Br$_2$ formation increases monotonically with temperature. No carbon deposit in the melt resulted, i.e., a low $f$ value. The melt assumed a nonwetting meniscus and the frozen polycrystalline ingot was easily lifted from the boat.

Other alkali metal halide crystals may be prepared from the above teaching by selecting the appropriate control parameters.

The bulk of our investigation centered upon the use of He as an inert carrier gas and CO$_2$ as a reactive carrier gas. While these gases are preferred, other gases such as argon, nitrogen No and NO$_2$ may be used. Our tests have shown mixtures of He and CO$_2$ to be effective carriers.

Likewise, while the nascent halogen source compounds investigated belonged to a group whose formula is RY$_n$X$_{4-n}$ where R is carbon and Y, X, or $n$ are as previously defined, we do not exclude other halide derivatives of nitrogen, sulfur, etc. as potential sources of nascent halogens.

Preferred Growth Methods

The RAP crystal growth of KBr was carried out in a modified vertical Bridgman apparatus, using vitreous silica crucibles of 1.7 to 3.2 cm i. d. (Technical Report AFWL-TR-72-152, Vol. II of ARPA Order No. 1256, Contract F29601-71-C-0101, Air Force Weapons Laboratory, Kirtland Air Force Base, New Mexico). The flow arrangement was similar to that employed in pyrolysis (see R. C. Pastor et al. Mat. Res. Bull., 10, 117, 1975) with the growth apparatus replacing the pyrolysis chamber. The exit gas was scrubbed of its Br$_2$ and HBr contents with NaOH solution. The melt was soaked for ~65 hours and crystal growth was carried out at a lowering rate of ~2 mm/hour with CH$_2$Br$_2$/He, while in the case of CF$_3$Br/He, the soak was ~3 hours and the lowering rate was ~5 mm/hour.

Repeated crystal growth runs indicated that CH$_2$Br$_2$ may still be a borderline case RAP agent for the growth of KBr. Sections of the ingot adhered to the crucible (vitreous silica).

The RAP crystal growth of KCl was carried out in a vertical Bridgman apparatus, using vitreous silica crucibles of 3 cm i.d. The carrier gas (He or CO$_2$) for CCl$_4$ flowed at ~0.5 cm$^3$/second.

The exit gas was scrubbed with NaOH solution. The melt was soaked for ~65 hours and crystal growth was carried out at a lowering rate of ~2 mm/hour.

In practice, crystal growth temperatures, soak times, and source flow rates will vary with the purity and nature of the materials employed.

Product Evaluation

Single crystals of various alkali metal halides were prepared by the RAP methods described above.

The single-crystal ingots of KBr were cut into cylinders with a string saw. An optical finish at the ends was obtained by polishing with Linde A in methanol. The infrared transparency was examined with the Beckman IR 12. The KBr grown in CH$_2$Br$_2$/He, diameter = 3.0 cm and thickness = 1.4 cm, gave a flat transmission from 2.5 to 18 $\mu$m and the knee of the curve was at 20 $\mu$m. The KBr grown in CF$_3$Br/He, diameter = 1.6 cm and thickness = 4.7 cm, showed in addition two moderately-sharp absorption bands with approximately equal peak intensities at 12 and 13 $\mu$m corresponding to an absorption coefficient of 0.005 cm$^{-1}$. Further work is in progress to resolve whether these absorptions are contributions from the surface and/or the bulk.

Window specimens, 10 cm in length, were fabricated from the KCl ingots. The Beckman IR 12 gave a flat curve at ~94% transmission from 2.5 to 12.5 $\mu$m, with the knee of the curve at 14.5$\mu$m for both specimens. In the ten micron range, the deviations are $\leq$ 0.5% which result indicates that the absorption coefficient at 10.6 $\mu$m would differ by $\leq$ 0.005 cm$^{-1}$.

The results of infrared transmission measurements in KCl are significant to the object of RAP growth, viz., removal of anion impurities. With CO$_2$ as the carrier, the presence of O$^{--}$ and OH$^-$ impurities in the melt would have led to the formation of CO$_3^{--}$ and HCO$_3^-$ impurities, respectively:

$$CO_2 + O^{--} \rightarrow CO_3^{--}, \tag{20}$$

and, $$CO_2 + OH^- \rightarrow HCO_3^-. \tag{21}$$

In KCl, an impurity level of 100 ppm CO$_3^{--}$ would have shown absorption bands from 6.6 to 14.7 $\mu$m, while 0.1 ppm HCO$_3^-$ would have given absorption bands from 3.0 to 15.9 $\mu$m (C. J. Duthler supra). From Equations 20 and 21, one can show that the HCO$_3^-$/CO$_3^{--}$ ratio is dependent on the OH$^-$/O$^{--}$ ratio which, in turn, is dependent on H$_2$O as shown in Equation 4 and, therefore, governed by the RAP-index. The results obtained indicate that the RAP growth procedure provides a very low value of the RAP-index and also effects an efficient removal of O$^{--}$ impurity in the condensed phase.

At 10.6 $\mu$m other KCl single crystals prepared by the above procedures yielded an optical absorption of 0.01%/cm and an ultimate strength of 4000 psi.

TABLE 1

| | RAP-Index for Chlorides from 600° to 1200° K | | |
|---|---|---|---|
| T, °K | Cl$_2$ RAP | COCl$_2$ RAP | CCl$_4$ RAP |
| 600 | 0.51 × 10$^{-3}$ | 0.47 × 10$^{-22}$ | 1.2 × 10$^{-20}$ |
| 800 | 0.55 × 10$^{-4}$ | 1.4 × 10$^{-20}$ | 0.83 × 10$^{-18}$ |
| 1000 | 1.3 × 10$^{-5}$ | 0.43 × 10$^{-18}$ | 1.1 × 10$^{-17}$ |
| 1200 | 0.56 × 10$^{-5}$ | 0.43 × 10$^{-17}$ | 0.62 × 10$^{-16}$ |

TABLE 2

Steady State Pyrolysis, CBr$_4$ Versus CCl$_4$ (He Flow <1 cm$^3$/s)

| | CBr$_4$:2.55 × 10$^{-8}$ mole/cm$^3$ | | | CCl$_4$:5.40 × 10$^{-6}$ mole/cm$^3$ | | |
|---|---|---|---|---|---|---|
| t, °C | $\gamma$ | f | mole Br$_2$/cm$^3$ | $\gamma$ | f | mole Cl$_2$/cm$^3$ |
| 400 | 0.17 | 0.0 | 0.22×10$^{-8}$ | — | — | — |
| 500 | 1.0 | 0.11 | 1.7 × 10$^{-8}$ | <0.00 | 0.0 | 1.9 × 10$^{-8}$ |
| 600 | 1.0 | 0.48 | 3.1 × 10$^{-8}$ | ~0.20 | ~0.17 | 0.82×10$^{-6}$ |
| 700 | 1.0 | 0.92 | 4.8 × 10$^{-8}$ | 0.85 | 0.22 | 3.8 × 10$^{-6}$ |
| 800 | 1.0 | 1.0 | 5.2 × 10$^{-8}$ | <0.9 | >0.22 | 4.0 × 10$^{-6}$ |
| 900 | 1.0 | 1.0 | 5.5 × 10$^{-8}$ | ~0.9 | ~0.20 | 3.9 × 10$^{-6}$ |

$\gamma$ = the fraction of CX$_4$ pyrolyzed
f = probability of reaction per path shown in Equation 12

TABLE 3

| Pyrolysis of CBr$_4$/He and CBr$_4$/CO$_2$ | | |
|---|---|---|
| | (mole Br$_2$/cm$^3$) × 10$^{8}$* | |
| °C | CBr$_4$/He | CBr$_4$/CO$_2$ |
| 400 | 0.22 | — |
| 500 | 1.7 | — |
| 600 | 3.1 ± 0.1 | 3.2 ± 0.1 |
| 700 | 4.8 ± 0.2 | 4.7 ± 0.1 |
| 800 | 5.2 ± 0.2 | 5.2 ± 0.2 |

TABLE 3-continued

Pyrolysis of $CBr_4$/He and $CBr_4/CO_2$

| °C | (mole $Br_2/cm^3$) × $10^{8*}$ | |
|---|---|---|
|  | $CBr_4$/He | $CBr_4/CO_2$ |
| 900 | 5.5 ± 0.4 | 5.4 ± 0.3 |

*Saturation of carrier gas between 24 to 25° C corresponds to (mole $Br_2/cm^3$) × $10^8$ = 5.5 ± 0.4 at 100% pyrolysis.

TABLE 4

Pyrolysis of $CCl_4$/He and $CCl_4/CO_2$

| °C | $CCl_4$/He | | $CCl_4/CO_2$ | |
|---|---|---|---|---|
|  | τ, min | A × $10^{8*}$ | τ, min | A × $10^{8*}$ |
| 500 | 3.9 | 0.94 | 3.8 | 2.8 |
| 600 | 3.7 | 41.2 | 3.9 | 49.0 |
| 700 | 3.8 | 191. | 4.1 | 191. |
| 800 | 3.7 | 201. | 4.1 | 181. |

*A = mole $Cl_2/cm^3$ in the effluent.

TABLE 5

Pyrolysis of $CH_2Br_2$/He

| °C | Input | | Output | | Pyrolysis$^{(d)}$ % |
|---|---|---|---|---|---|
|  | Tot.flow, $cm^3$/sec | A$^{(a)}$ | B$^{(b)}$ | C$^{(c)}$ |  |
| 200 | 0.44 | 1.04 | <1.06 | <1.8 | <0.18 |
| 400 | 0.44 | 1.03 | 3.79 | 43. | 4.2 |
| 500 | 0.43 | 1.03 | 11.9 | 163. | 16. |
| 600 | 0.43 | 1.01 | 7.09 | 189. | 18.7 |
| 700 | 0.43 | 1.01 | 1.95 | 192. | 19.0 |
| 800 | 0.43 | 1.01 | <1.0 | 217. | 21. |
| 900 | 0.42 | 1.01 | <0.50 | 244. | 24. |

$^{(a)}$A = (mole $CH_2Br_2$/sec) × $10^6$, equals the theoretical output of (mole $Br_2$/sec) × $10^6$ for 100% pyrolysis.
$^{(b)}$B = (mole $Br_2$/sec) × $10^9$ by thiosulfate titration.
$^{(c)}$C = (total mole $Br_2$/sec) × $10^9$ from $Br_2$ and HBr/2.
$^{(d)}$Pyrolysis % = C/10 . A.

TABLE 6

Pyrolysis of $CF_3Br$/He

| °C | Input | | Output | Pyrolysis$^{(c)}$ % |
|---|---|---|---|---|
|  | Tot.flow, $cm^3$/sec | A$^{(a)}$ | B$^{(b)}$ |  |
| 600 | 0.26 | 1.23 | 20.4 | 3.3 |
| 700 | 0.27 | 1.25 | 95.3 | 15.2 |
| 800 | 0.29 | 1.37 | 340. | 49.6 |

$^{(a)}$A = (mole $CF_3Br$/sec) × $10^6$ and half this value is the theoretical (mole $Br_2$/sec) × $10^6$ for 100% pyrolysis.
$^{(b)}$B = (mole $Br_2$/sec) × $10^9$ by thiosulfate titration.
$^{(c)}$Pyrolysis % = 0.2B/A.

What we claim is:

1. A processing method for growing ultra pure laser quality single crystals from alkali metal halide powders selected from the group consisting of alkali metal chlorides, alkali metal bromides, and alkali metal iodides whereby material purification and crystal growth occurs in a continuous uninterrupted sequence, comprising:

charging a crucible with said powders and mounting said crucible in a furnace, increasing the temperature of said furnace to a level sufficient to cause said powders to melt and remain molten thereby creating an environment which will ensure the dissociation of selected halogen source gasses which are subsequently introduced into said furnace, purging contaminants from the interior surface of said crucible, which simultaneously scrubbing said molten charge to remove cation and anion impurities, by flowing a nascent halogen source gas, selected from the group whose formula is $RY_nX_{4-n}$ where R is carbon, Y is a strongly covalently bonded atomic substituent, X is a halogen and $n$ ranges from 1 to 3, having a dissociatable halogen which corresponds to the halide of the alkali halide being grown, in a carrier gas selected from the group consisting of He, $CO_2$ and mixtures of He and $CO_2$, through said furnace at a preselected carrier gas - halogen source material ratio and a gaseous flow rate based on the preselected halogen source material decay constant whereby the formation of nascent halogens is favored for an extended time interval ranging from 50 to 70 hours, and causing a single crystal to be formed from said melt in the presence of said flowing halogen gas by slowly removing said crucible from said furnace and allowing said crystal to slowly cool to ambient temperature while maintaining a constant purge of said halogen gas.

2. The method of claim 1 wherein alkali metal chloride single crystal growth is initiated by a seeding technique in a vertical crystal growth apparatus, said furnace temperature ranges from 500° to 800° C and said source gas is taken from the group consisting of $CCl_4$ and $COCl_2$, in a carrier mixture of He and $CO_2$.

3. The method of claim 1 wherein an alkali metal chloride single crystal growth is initiated by a crystal nucleation technique, in a horizontal crystal growth apparatus, said furnace temperature ranges from 500° to 800° C, and said source gas is taken from the group consisting of $CCl_4$ and $COCl_2$ vapors in a carrier mixture of He and $CO_2$.

4. The method of claim 2 wherein said source gas is a mixture of $CCl_4$ vapors, He, and gaseous $CO_2$ and said furnace temperature is 500° to 800° C.

5. The method of claim 3 wherein said source gas is a mixture of $CCl_4$ vapors, He, and gaseous $CO_2$ and said furnace temperature is 500° to 800° C.

6. The method of claim 1 wherein a KCl single crystal is prepared by placing KCl powder in said crucible, said furnace temperature is raised to 800° ± 25° C, and said source gas is taken from the group consisting of $CCl_4$ and $COCl_2$ vapors in a carrier mixture of He and $CO_2$.

7. The method of claim 6 wherein said source gas is a mixture of $CCl_4$ vapors, He, and $CO_2$.

8. The method of claim 6 wherein said source gas is a mixture of He and $CCl_4$ vapors.

9. The method of claim 1 wherein a NaCl single crystal is prepared by placing NaCl powder in said crucible, said furnace temperature is raised to 825° ± 25° C, and said source gas is taken from the group consisting of $CCl_4$ and $COCl_2$ vapors in a carrier mixture of He and $CO_2$.

10. The method of claim 9 wherein said source gas is a mixture of $CCl_4$ vapors in He and $CO_2$.

11. The method of claim 1 wherein said halide powder is an alkali metal bromide, said source gas is a mixture of He and vapors taken from the group consisting of $CH_2Br_2$, $CH_3Br$, and $CF_3Br$ and said crucible temperatures range from 700° to 900° C.

12. The method of claim 11 wherein said bromide powder is KBr, and said source gas is a mixture of He and $CH_2Br_2$ vapors.

13. The method of claim 11 wherein said source gas is a mixture of He and a mixture of vapors taken from the group consisting of $CH_2Br_2$, $CH_3Br$, and $CF_3Br$.

14. The method of claim 11 wherein said bromide is NaBr powder, thereby resulting in the production of NaBr single crystals.

15. The method of claim 1 wherein said halide is an alkali metal iodide, said furnace temperature ranges from 450° to 650° C, and said source gas is a mixture of He and an organic halide taken from the group consisting of n-$C_4H_9I$, $C_6H_5I$, $CF_3I$, $CH_2CHI$, and $I_2$.

16. The method of claim 15 wherein said iodide is LiI and said source gas is a mixture of He and an organic halide taken from the group consisting of $CF_3I$, $C_6H_5I$ and $I_2$.

17. The method of claim 15 wherein said iodide is NaI and said source gas is a mixture of He and an organic halide taken from the group consisting of $CF_3I$, $C_6H_5I$, and $I_2$.

18. The method of claim 15 wherein said iodide is KI and said source gas is a mixture of He and $CH_2CHI$.

* * * * *